(12) United States Patent
Ishaug

(10) Patent No.: US 7,925,170 B2
(45) Date of Patent: Apr. 12, 2011

(54) PREDISTORTION CIRCUIT INCLUDING DISTORTION GENERATOR DIODES WITH ADJUSTABLE DIODE BIAS

(75) Inventor: Brian Ishaug, Sugar Land, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 673 days.

(21) Appl. No.: 11/834,873

(22) Filed: Aug. 7, 2007

(65) Prior Publication Data

US 2009/0041474 A1 Feb. 12, 2009

(51) Int. Cl.
*H04B 10/04* (2006.01)

(52) U.S. Cl. ........ 398/193; 398/194; 398/159; 327/318; 327/317; 327/362

(58) Field of Classification Search .............. 398/182, 398/183, 186, 187, 188, 192, 193, 194, 195, 398/196, 197, 198, 200, 201, 158, 159; 327/318, 327/317, 306, 362, 551, 553, 307

See application file for complete search history.

(56) References Cited

U.S. PATENT DOCUMENTS

| | | | |
|---|---|---|---|
| 4,068,186 A | 1/1978 | Sato et al. | |
| 4,992,754 A | 2/1991 | Blauvelt et al. | |
| 5,132,639 A | 7/1992 | Blauvelt et al. | |
| 5,252,930 A | 10/1993 | Blauvelt | |
| 5,321,710 A | 6/1994 | Cornish et al. | |
| 5,361,156 A | 11/1994 | Pidgeon | |
| 5,418,637 A | 5/1995 | Kuo | |
| 5,424,680 A * | 6/1995 | Nazarathy et al. | ............ 330/149 |
| 5,436,749 A | 7/1995 | Pidgeion, Jr. et al. | |
| 5,481,389 A | 1/1996 | Pidgeion et al. | |
| 5,600,472 A | 2/1997 | Uesaka | |
| 5,703,530 A | 12/1997 | Sato et al. | |
| 6,055,278 A | 4/2000 | Ho et al. | |
| 6,061,161 A | 5/2000 | Yang et al. | |
| 6,122,085 A * | 9/2000 | Bitler | ............ 398/193 |
| 6,133,790 A | 10/2000 | Zhou | |
| 6,388,518 B1 | 5/2002 | Miyatani | |
| 6,759,897 B2 | 7/2004 | Ciemniak | |
| 6,919,765 B2 | 7/2005 | Zappala | |
| 6,943,628 B2 | 9/2005 | Weldon | |
| 7,466,925 B2 * | 12/2008 | Iannelli | ............ 398/182 |

(Continued)

OTHER PUBLICATIONS

International Search Report and Written Opinion dated Mar. 30, 2009 issued in related International Patent Application No. PCT/US2009/033175.

(Continued)

*Primary Examiner* — Hanh Phan

(74) *Attorney, Agent, or Firm* — Grossman Tucker Perreault & Pfleger, PLLC; Norman S. Kinsella

(57) ABSTRACT

A predistortion circuit provides a predistorted input signal that compensates for distortion generated by a non-linear amplifier such as a laser device. The predistortion circuit may be used in an optical transmitter designed for broadband applications, such as a laser transmitter used for forward path CATV applications. The predistortion circuit may include a primary signal path and a secondary signal path that receive an input signal. A second order distortion generator on the secondary signal path generates predistortion of a magnitude corresponding to the magnitude of, but at an opposite phase to, the distortion generated by the non-linear amplifier. The second order distortion generator includes diodes with an adjustable diode bias to control phase, magnitude and/or magnitude/phase versus frequency of the predistortion.

21 Claims, 7 Drawing Sheets

U.S. PATENT DOCUMENTS

2001/0054927 A1    12/2001    Zhou et al.

OTHER PUBLICATIONS

Applied Optoelectronics, Inc., "DFB-1310-P3-xx-A3-xx Laser Module", Applied Optoelectronics, Inc. 2006, pp. 1-6.

Applied Optoelectronics, Inc., "DFB-1310-P2-xx-A3-xx Predistorted Laser Transmitter", Applied Optoelectronics, Inc. 2005, pp. 1-5.

Applied Optoelectronics, Inc., "DFB-1xxx-P3-xx-A3-xx Laser Module", Applied Optoelectronics, Inc. 2006, pp. 1-8.

* cited by examiner

PREDISTORTION CIRCUIT INCLUDING DISTORTION GENERATOR DIODES WITH ADJUSTABLE DIODE BIAS

TECHNICAL FIELD

The present invention relates to predistortion circuits and more particularly, to a predistortion circuit having distortion generator diodes with adjustable diode bias to control predistortion phase and/or magnitude.

BACKGROUND INFORMATION

A laser may be used as an optical transmitter that transmits light at a given wavelength. The power (i.e., amplitude) of the laser light is modulated by corresponding modulation of the power used to drive the laser. For example, the optical transmitter may be directly modulated to carry a wide-band RF signal. In a directly-modulated electrically pumped semiconductor laser, the electrical current that drives or pumps the laser is modulated.

The use of a laser modulated to carry a wide-band RF signal results in distortion due to the non-linear nature of the laser device. Distortion includes even-order distortion and odd-order distortion. Even-order distortion includes composite second order (CSO) distortion products, i.e. distortion products of the type $2f_1$, $2f_2$, $f_2-f_1$, and $f_2+f_1$. In particular, CSO is a second-order distortion that combines signals at frequencies A and B, as A±B. Odd-order distortion includes composite triple beat (CTB) distortion. CTB (also known as C/CTB) is a third-order distortion product that combines signals at frequencies A, B, and C as A+B−C.

Several techniques have been proposed or employed to compensate for distortion by injecting distortion of equal magnitude but opposite phase to the distortion produced by the laser device. For example, a predistortion circuit may be employed to predistort the RF signal being applied to modulate the laser. One such predistortion circuit includes split signal paths—a main or primary signal path and a secondary signal path. A small sample of the RF input is tapped off the main signal path and a distortion generator in the secondary signal path generates distortion (i.e., predistortion). The predistortion is then recombined with the RF signal on the main signal path such that the predistortion is of equal magnitude but opposite sign to the laser-induced distortion.

Such existing predistortion circuits may not be effective to compensate for distortion over a wide range of frequencies and particularly at higher frequencies, for example, in broadband applications such as forward-path CATV applications. Non-linear laser devices may have amplitude or magnitude and phase distortion characteristics dependent on the frequency of the modulating signal. Such frequency dependent nonlinearities are sometimes referred to as frequency tilt. Existing predistortion circuits may require other components, in addition to the distortion generator, to adjust the magnitude, frequency tilt and phase of the predistortion to match the laser-induced distortion.

BRIEF DESCRIPTION OF THE DRAWINGS

These and other features and advantages will be better understood by reading the following detailed description, taken together with the drawings wherein.

DETAILED DESCRIPTION

A predistortion circuit, consistent with embodiments of the present invention, may be used with a non-linear amplifier, such as a laser, to provide predistortion that compensates for distortion generated by the non-linear amplifier, for example, in broadband applications. As will be described in greater detail below, embodiments of the predistortion circuit may include a distortion generator with integrated control of predistortion phase, magnitude, and/or magnitude/phase versus frequency (i.e., frequency tilt). The distortion generator may include diodes that are adjustably biased to improve or control magnitude and phase match between the predistortion and the distortion generated by the non-linear amplifier, which improves the distortion compensation provided by the predistortion circuit, for example, when used with higher frequency RF signals.

Figure 1:
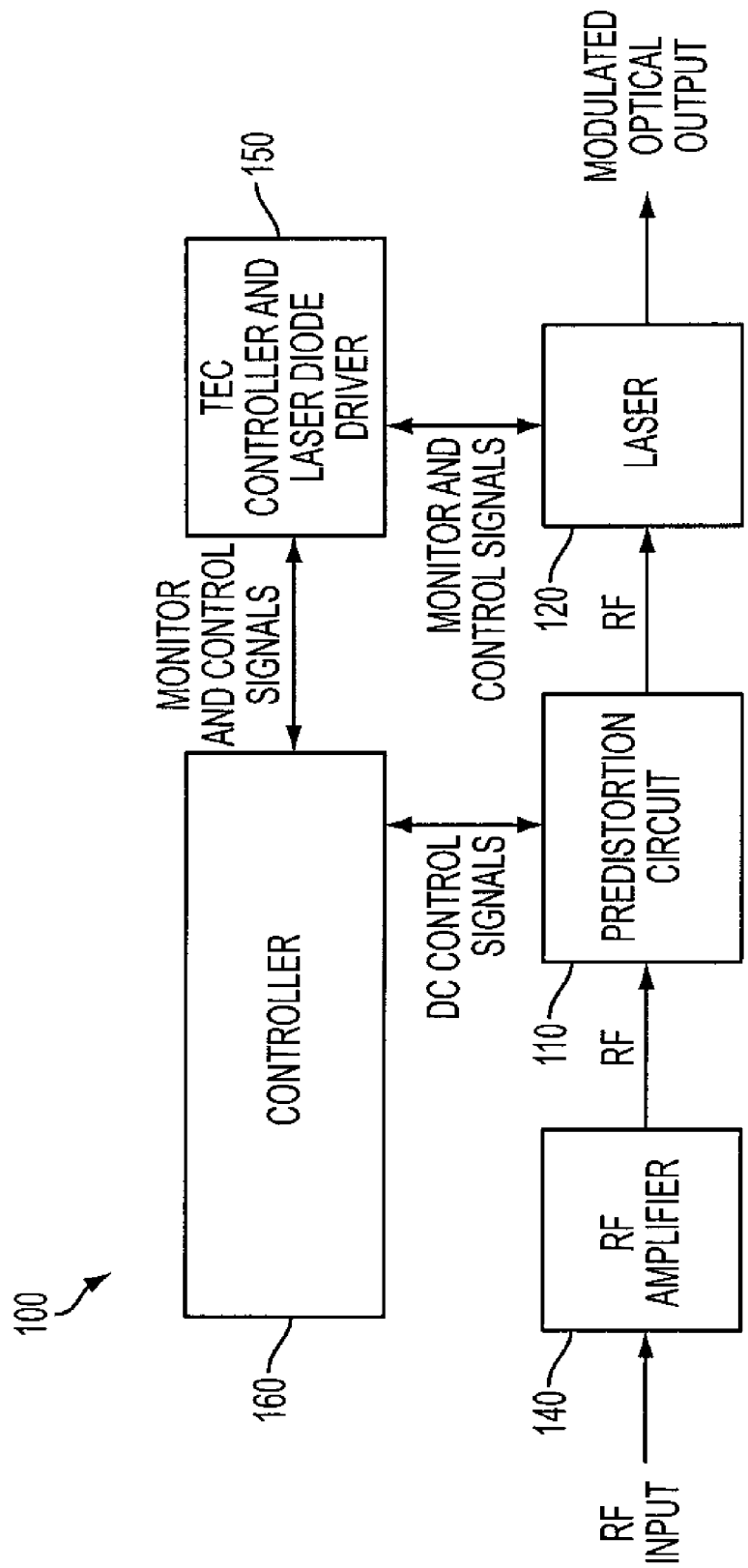
FIG. 1 is a schematic diagram of an optical transmitter including a predistortion circuit, consistent with one embodiment of the invention.

Referring to FIG. 1, an optical transmitter 100 may include a predistortion circuit 110 to generate predistortion that compensates for distortion generated by a laser 120 when a RF signal modulates the laser 120 to produce a modulated optical output. As used herein, "compensate" or "compensating" for distortion means reducing distortion to a point that is tolerable in a particular system and does not necessarily require elimination of distortion. To compensate for distortion generated by the laser 120, the predistortion may be generated by the predistortion circuit 110 with a magnitude substantially equal to the magnitude of the distortion produced by the laser 120 and a phase that is substantially opposite the phase of the distortion produced by the laser 120.

According to one embodiment, the optical transmitter 100 may include a RF amplifier 140 to receive and amplify a RF input signal (e.g., a multi-channel carrier multiplex signal). The predistortion circuit 110 may then receive the amplified RF signal, generate the predistortion and combine the predistortion with the RF signal that modulates the laser 120. The laser 120 may be a directly-modulated electrically pumped semiconductor laser, such as a laser diode. One embodiment of the optical transmitter 100 may further include thermoelectric cooler (TEC) controller and laser diode driver circuitry 150 to control the temperature of and to bias the laser 120. A microcontroller 160 may be used to control the components and the operation of the optical transmitter 100.

One example of an optical transmitter 100 is a laser transmitter designed for forward-path CATV applications. In such "broadband" applications, the optical transmitter 100 and particularly the laser 120 may be designed for high frequency operation, for example, up to about 1 GHz. The laser 120, the RF amplifier 140, the TEC controller and laser diode driver circuitry 150 and the microcontroller 160 may all include components known to those skilled in the art for use in a laser transmitter, such as the type available from Applied Optoelectronics, Inc. The predistortion circuit and methods described herein may also be used in other applications (e.g., using different or even higher frequencies) and/or with other types of optical transmitters. Embodiments of the predistortion circuit may also be used with any non-linear amplifier or device that generates distortion that can be compensated with predistortion.

Figure 2A:
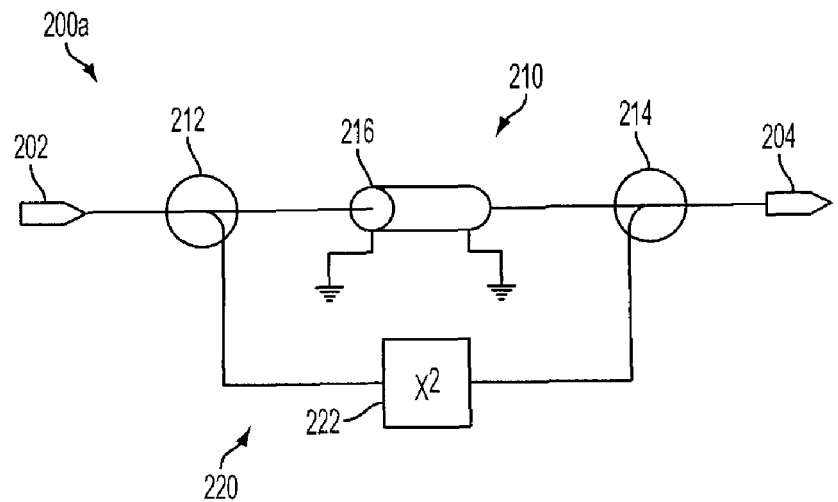
FIGS. 2A-2C are schematic diagrams of predistortion circuits, consistent with embodiments of the invention.
Figure 2B:
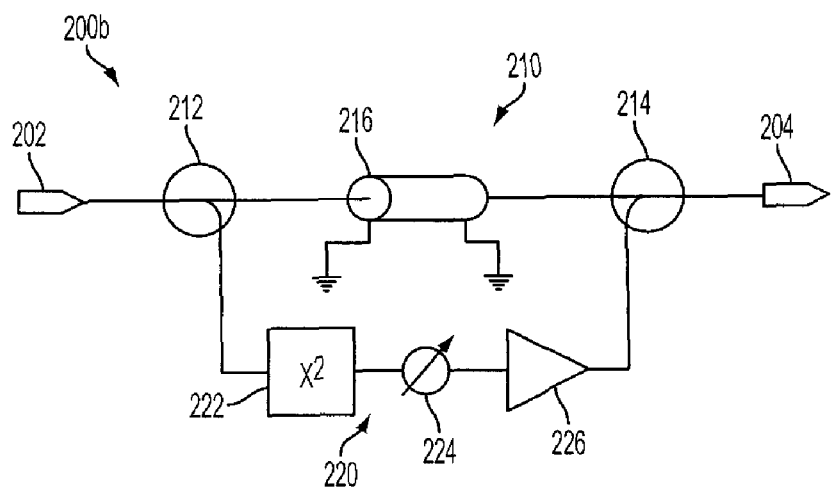
Figure 2C:
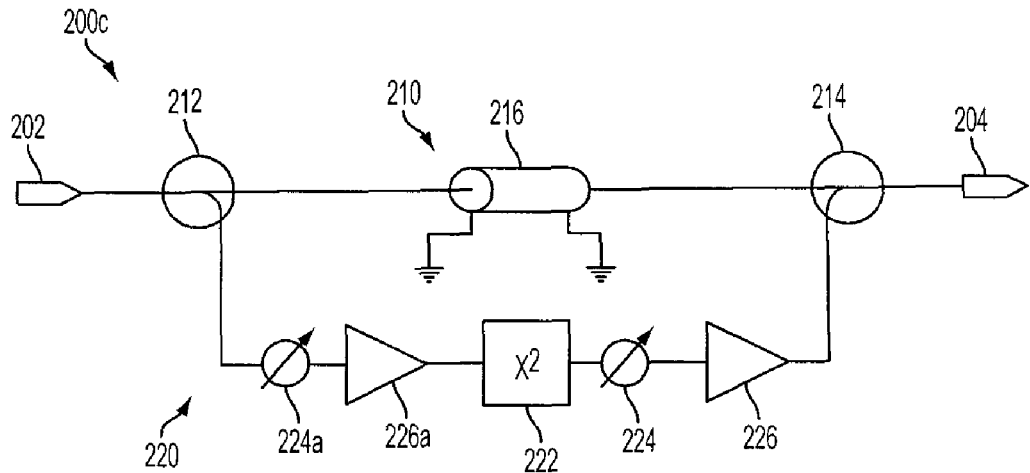

Predistortion circuits 200a-200c, consistent with embodiments of the present invention, are shown in greater detail in FIGS. 2A-2C. Each of the predistortion circuits 200a-200c receives a RF input signal at a signal input 202, generates the predistortion to predistort the RF input signal, and provides a predistorted RF signal at a predistorted signal output 204. Each of the predistortion circuits 200a-200c may include a primary signal path 210 and a secondary signal path 220 that are coupled together, for example, using directional couplers such as a directional splitter 212 and a directional combiner 214. At the directional splitter 212, at least a portion of the RF input signal is received on the primary and secondary signal paths 210, 220, respectively. The secondary signal path 220 includes a distortion generator 222 that generates the predistortion from the RF input signal received on the secondary signal path 220. In the exemplary embodiment, the distortion generator 222 is a second order distortion generator that generates composite second order (CSO) distortion. Other types of distortion generators may also be used, such as third order distortion generators that generate composite triple beat (CTB) distortion or distortion generators that generate both CSO and CTB.

At the directional combiner 214, the predistortion generated by the second order distortion generator 222 on the secondary signal path 220 is combined with the RF input signal on the primary signal path 210 with a desired magnitude and phase to produce the predistorted RF signal that compensates for distortion. The primary signal path 210 may include a delay element 216, such as a transmission line of a selected length, which delays the RF input signal on the primary signal path 210 to correspond to the delay caused by generating the predistortion on the secondary signal path 220. Such a delay helps to ensure that the predistortion on the secondary signal path 220 remains in phase with the RF input signal on the primary signal path 210.

In the predistortion circuits 200a-200c, the distortion generator 222 may control the magnitude of the predistortion, the phase of the predistortion and/or magnitude and phase versus frequency (i.e., frequency tilt). In the predistortion circuit 200a, for example, the distortion generator 222 may provide the only control for adjusting predistortion magnitude. The distortion generator 222 in this embodiment of the predistortion circuit 200a may provide substantially frequency independent magnitude control without any need for a separate magnitude control element. Fixed gain elements and/or fixed attenuation elements may also be provided before and/or after the distortion generator 222 in the predistortion circuit 200a.

In the predistortion circuits 200b, 200c, the secondary signal path 220 may also include one or more gain control elements, such as a variable attenuator 224, 224a and/or a variable gain element 226, 226a, before and/or after the distortion generator 222 to control a magnitude of the predistortion generated by the distortion generator 222. Variable gain control elements help to ensure that the magnitude of the predistortion corresponds sufficiently to the magnitude of the distortion being compensated. This allows magnitude and phase versus frequency control to be integrated into the function of the second order generator 222, as will be described below.

Figure 3A:
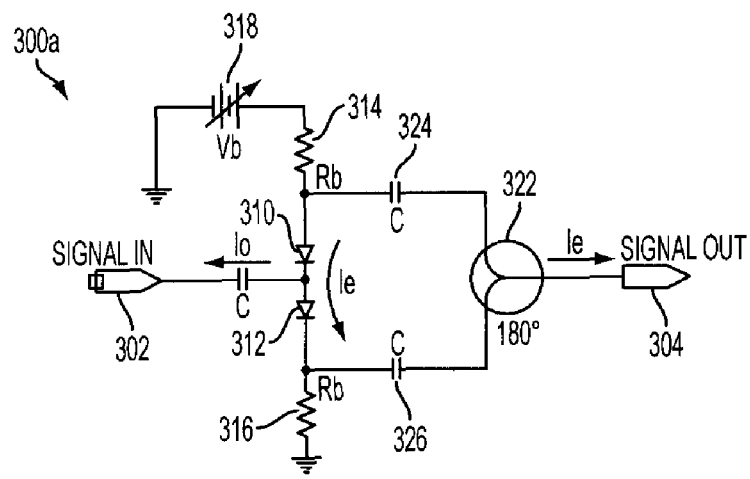
FIGS. 3A-3C are schematic diagrams of second order distortion generators, consistent with embodiments of the invention.
Figure 3B:
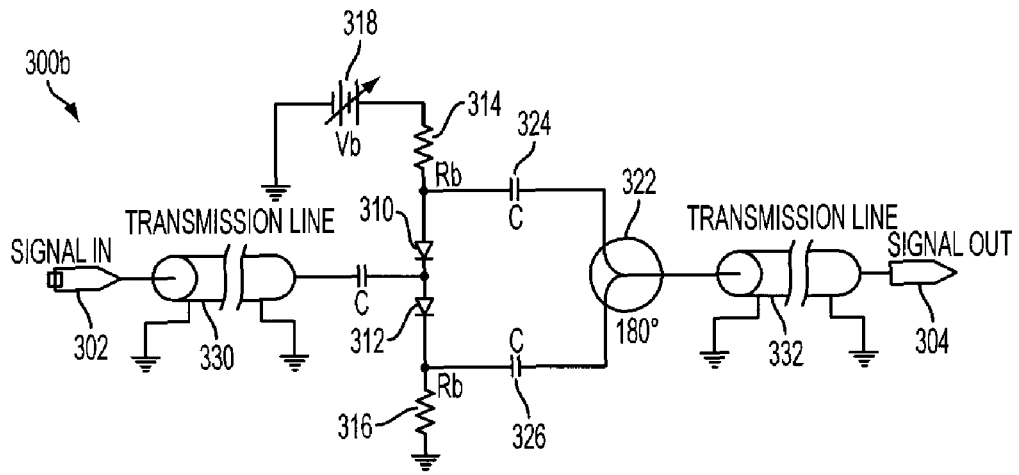
Figure 3C:
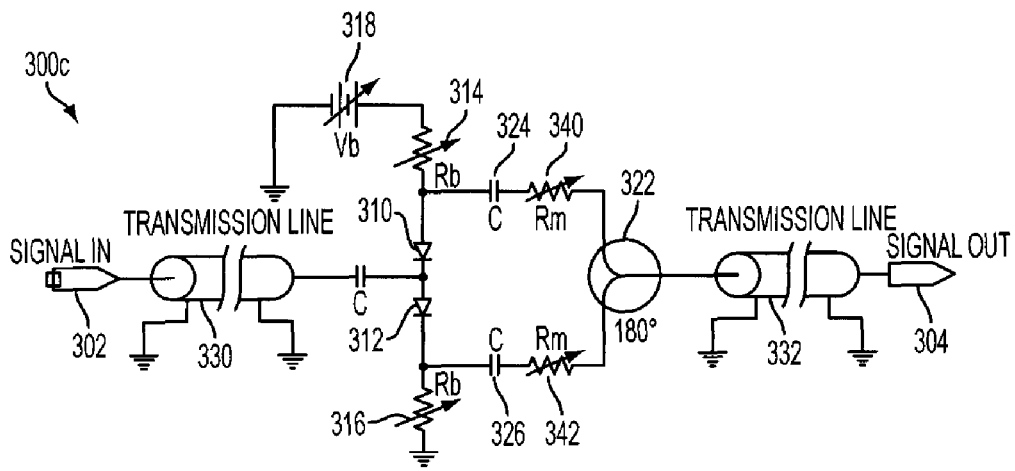

Second order distortion generators 300a-300c, consistent with embodiments of the present invention, are shown in greater detail in FIGS. 3A-3C. The second order distortion generators 300a-300c may be used in the predistortion circuits 200a-200c described above. The second order distortion generators 300a-300c each receive the RF input signal at an input 302, generate composite second order (CSO) distortion from the RF input signal, and provide the CSO distortion at an output 304.

The second order distortion generators 300a-300c may include diodes 310, 312 connected and arranged to generate the CSO distortion. One example of the diodes 310, 312 is a matched series pair of diodes, such as the series pair of Schottky diodes from the HSMS-286x family available from Avago Technologies. The diodes 310, 312 are connected and arranged relative to the RF input such that current from the diodes 310, 312 is added and diode voltages are opposite. Thus, odd order components of the current from the diodes 310, 312 cancel out, resulting in even order components. In other words, the second order distortion generators 300a-300c produce second order distortion by outputting even order components of current ($I_e$) and reflecting odd order components of current ($I_o$). At least a portion of this even order current ($I_e$) may be coupled to the output 304 via a 180° combiner 322, which may be active or passive. Although the exemplary embodiment shows one arrangement of a series pair of diodes, other arrangements and numbers of diodes are possible such that the diodes are capable of producing distortion corresponding to the distortion to be compensated.

Figure 5:
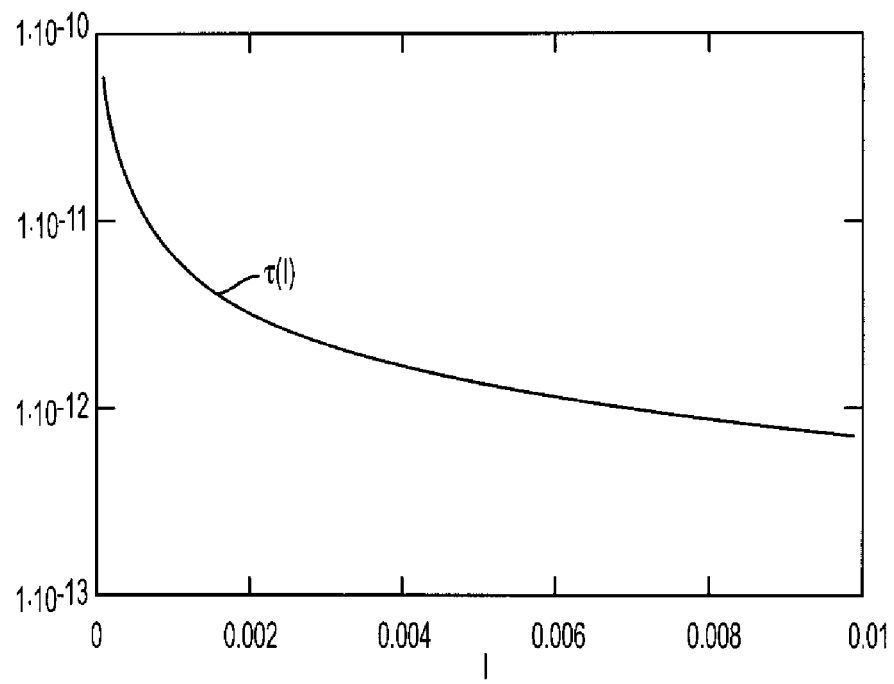
FIG. 5 is a plot illustrating the $R_jC_j$ time constant ($\tau(I)$) as a function of bias current ($I_b$) for a diode that may be used in a second order distortion generator, consistent with one embodiment of the invention.
Figure 6:
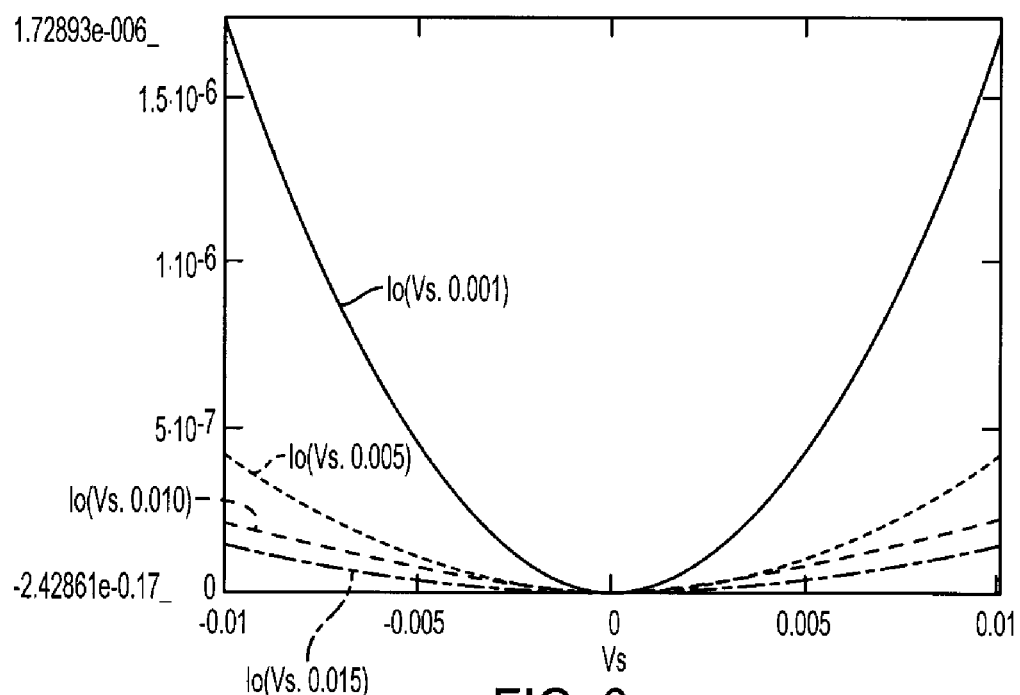
FIG. 6 is a plot illustrating the output current ($I_o$) as a function of instantaneous source voltage ($V_s$) at different diode bias current levels of a second order distortion generator, consistent with one embodiment of the invention.
Figure 7:
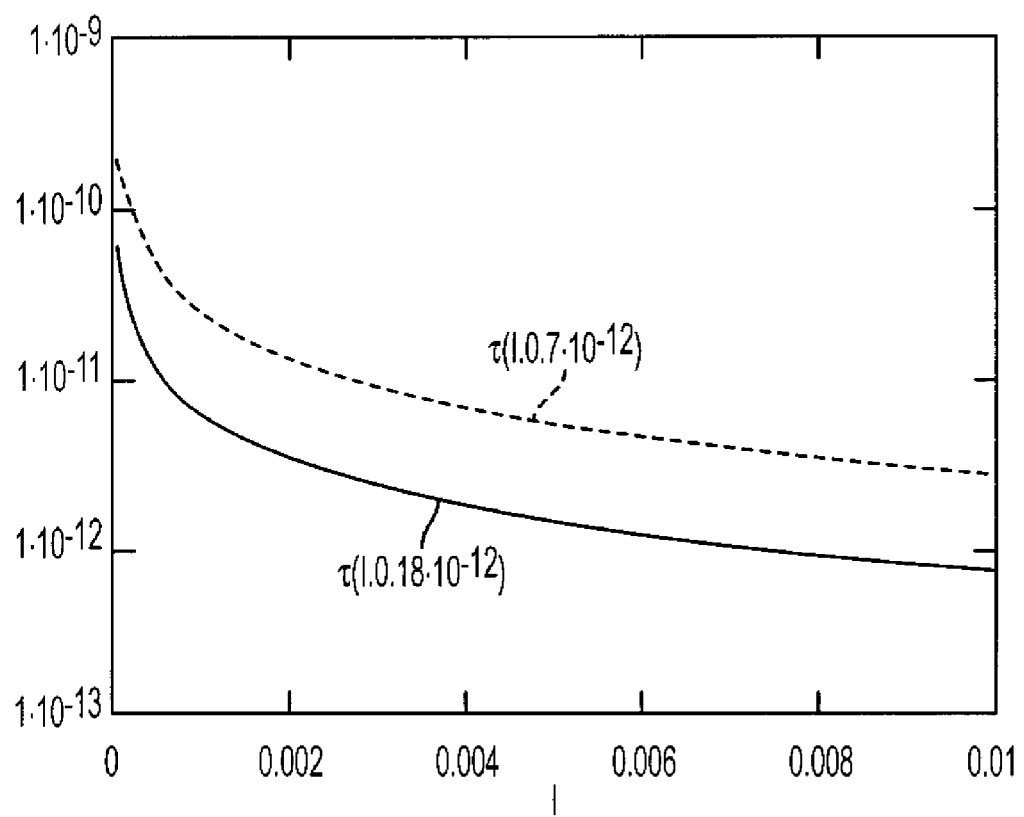
FIG. 7 is a plot illustrating the $R_jC_j$ time constant ($\tau(I)$) as a function of bias current ($I_b$) for diodes having a different zero bias junction capacitance ($C_j0$), which may be used in a second order distortion generator, consistent with one embodiment of the invention.

The second order distortion generators 300a-300c may also include bias resistors 314, 316 ($R_b$) coupled in series with the diodes 310, 312. A DC bias voltage ($V_b$) 318 coupled to the network of diodes 310, 312 and bias resistors 314, 316 ($R_b$) results in a bias current ($I_b$) across the diodes 310, 312. In general, the diodes 310, 312 are biased to operate in the forward bias region when generating distortion. An adjustable bias control may adjust the bias current ($I_b$) provided to the diodes 310, 312 to control predistortion phase and/or magnitude. The effects of the bias current on the junction capacitance and the RC time constant of the diodes and on the phase and magnitude of predistortion are illustrated in FIGS. 5-7 and described in greater detail below.

To provide the adjustable bias control, the DC bias voltage ($V_b$) 318 may be controlled by any circuit or device capable of varying the DC voltage ($V_b$) 318 applied to the diode network. In one embodiment, the adjustable DC bias voltage ($V_b$) 318 may be controlled by a microcontroller with a digital-to-analog converter (DAC) (e.g., the microcontroller 160 in the laser transmission system 100). The adjustable DC voltage ($V_b$) 318 may also be controlled using a potentiometer. Although the exemplary embodiment shows one configuration and arrangement of the bias resistors together with the diodes, other configurations and bias resistor networks are possible to provide a desired bias current across the diodes. The second order distortion generators 300a-300c may also include DC blocking capacitors 324, 326 coupled to the diodes 310, 312, respectively.

The second order generators 300a-300c may be impedance matched such that the magnitude of the predistortion may be controlled over a limited range with substantially no effect on the magnitude and phase versus frequency. In the second order generator 300a, for example, the resistance ($R_b$) of the resistors 314, 316 may be chosen such that the input impedance is maintained substantially equal to the source impedance across a limited adjustment range of the adjustable bias voltage ($V_b$). The 180° combiner 322 may be designed to be substantially impedance matched to the even order output impedance of the diodes 310, 302 and bias resistor network (e.g. resistors 314, 316) over the same adjustment range of the adjustable bias voltage ($V_b$). Parity may be maintained by providing equality of the bias resistors 314, 316 and strategic placement of the DC blocking capacitors 324, 326.

The second order generators 300a-300c may also be configured to provide independent control of magnitude and magnitude/phase versus frequency. The magnitude/phase versus frequency of the second order generators 300a-300c may be controlled, for example, by changing the impedance match and/or by changing the diode junction capacitance with changes in the bias voltage ($V_b$). When impedance mismatch is used to control magnitude/phase versus frequency, the input and output impedance of the second order generator 300a may not be maintained across the adjustment range of the bias voltage ($V_b$) and the resistance $R_b$ may not be chosen to maintain impedance match over the adjustment range of the bias voltage ($V_b$). The lower limits of the bias voltage ($V_b$), according to this embodiment, may be primarily dictated by how much reflected odd order components can be tolerated.

The second order generators 300a-300c may also include elements placed before and/or after the second order generators 300a-300c to provide the desired change in magnitude/phase versus frequency as a result of the change in input and output impedance of the second order generator. The second order generators 300b, 300c, for example, include transmission lines 330, 332 with characteristic impedance of the source and load. When the impedance is matched, the transmission is essentially frequency independent. When the impedance becomes mismatched, the transmission magnitude and phase will no longer be frequency independent. The change in magnitude/phase versus frequency may generally depend upon the lengths of the transmission lines 330, 332 and the amount of impedance mismatch.

The second order generators 300a-300c may also include adjustable impedance matching elements used in conjunction with the adjustable diode bias to give independent control over diode bias current and input/output impedance match. The second order generator 300c, for example, includes adjustable resistors 314, 316 providing an adjustable bias resistance ($R_b$) and adjustable resistors 340, 342 providing an adjustable impedance matching resistance ($R_m$). The adjustable impedance matching elements allow the magnitude/phase versus frequency effects caused by junction capacitance and diode bias related effects to be independently controlled from the magnitude/phase versus frequency effects caused by impedance mismatch. In the second order generator 300c, for example, diode bias current may be decreased while the resistance $R_b$ and $R_m$ are decreased to maintain impedance match. In this case, the increase in diode junction capacitance or other diode bias related effects will cause the change in magnitude and phase versus frequency because the impedance match is maintained.

Figure 4:
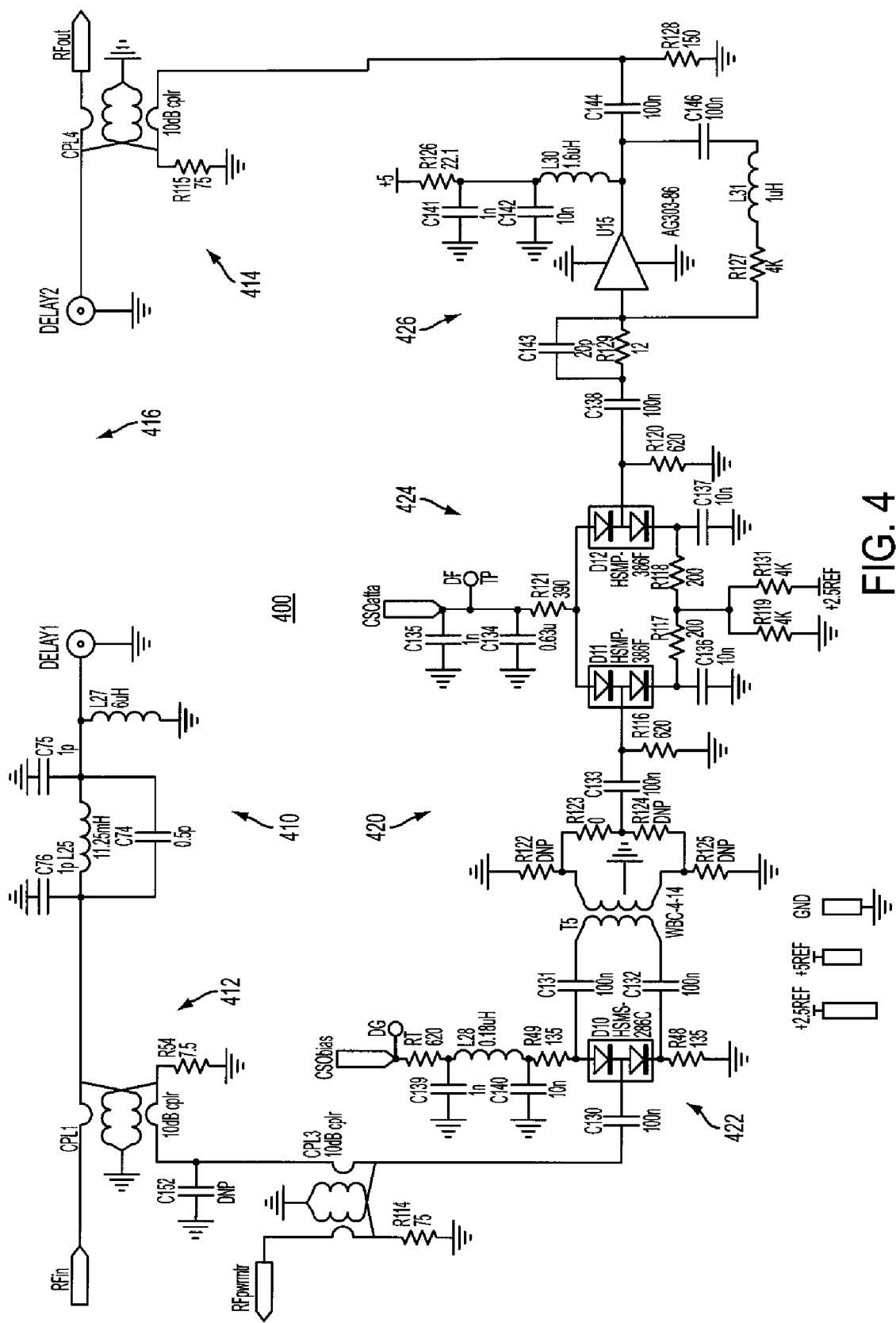
FIG. 4 is a schematic diagram of a predistortion circuit, consistent with another embodiment of the present invention.

Referring to FIG. 4, one implementation of a predistortion circuit 400, consistent with an embodiment of the present invention, is shown in greater detail. This embodiment of the predistortion circuit 400 includes primary and secondary signal paths 410, 420. The primary signal path 410 may be coupled to the secondary signal path 420 at directional couplers 412, 414 and may include a delay element 416. The secondary signal path 420 may include a second order distortion generator 422, a variable attenuator 424 and a gain element 426. In this exemplary implementation, the bias voltage (CSObias) and adjustable bias control may be provided by a DAC in a microcontroller (not shown). The variable attenuator 424 may be eliminated if the second order distortion generator 422 is used as the only control of predistortion magnitude. This implementation of the predistortion circuit 400 may also include adjustable impedance matching elements, as described above, and may be configured according to the method described below. Those skilled in the art will recognize other implementations of the predistortion circuit and the distortion generator consistent with the embodiments described herein.

According to embodiments of the present invention, the bias current ($I_b$) across the distortion generator diodes may be adjusted to control predistortion phase and magnitude such that the predistortion is capable of compensating for the distortion generated by a non-linear amplifier (e.g., a laser) at a highest frequency component of interest for the non-linear amplifier. With respect to predistortion phase, the junction capacitance ($C_j$) and the $R_jC_j$ time constant of the distortion generator diodes may affect the phase of the predistortion generated by the second order distortion generator. At higher $R_jC_j$ time constants, for example, the phase of the predistortion may deviate significantly from the phase of the input signal on the primary signal path particularly at higher frequencies. The bias current ($I_b$) may thus be adjusted to reduce the effects of the junction capacitance ($C_j$) and the $R_jC_j$ time constant of the diodes or may be adjusted such that the effects of the junction capacitance ($C_j$) and the $R_jC_j$ time constant control magnitude and phase versus frequency. FIG. 5 shows a plot of the $R_jC_j$ time constant as a function of the bias current ($I_b$) for a typical Schottky diode. As indicated by this plot, at higher diode bias currents ($I_b$), the $R_jC_j$ time constant is minimized (e.g., decreasing phase shift caused by the $R_jC_j$ time constant) and at lower diode bias currents ($I_b$), the $R_jC_j$ time constant is maximized (e.g., increasing magnitude/phase versus frequency effects).

In one embodiment, therefore, the bias current ($I_b$) may be set high enough (e.g., using the adjustable bias control) to minimize the deviation in phase match between the predistortion on the secondary signal path (e.g., signal path 210, 410) and the input signal on the primary signal path (e.g., signal path 220, 420). Some amount of phase deviation or mismatch may be tolerable in some systems depending upon the target optimization specifications. For a particular system, an acceptable deviation may be determined at the highest frequency of interest for the laser or other non-linear amplifier being compensated, and the bias current ($I_b$) may be set high enough such that the phase deviation is less than or equal to this acceptable deviation. A minimum acceptable bias current may be determined to correspond to this acceptable deviation, and the bias current ($I_b$) may be set or maintained at a level higher than the minimum acceptable bias current. Because the phase shift caused by the $R_jC_j$ time constant is minimized at higher levels of bias current ($I_b$), distortion compensation is improved at the higher frequencies of interest.

The diode bias current ($I_b$) across the distortion generator diodes may also be adjusted to control a magnitude of the predistortion. At higher diode bias currents ($I_b$), for example, the magnitude of the predistortion may be reduced. FIG. 6 shows a plot of the output current ($I_o$) of a second order distortion generator as a function of instantaneous source voltage ($V_s$) for several diode bias current ($I_b$) levels (1 mA, 5 mA, 10 mA, and 15 mA) applied to a typical Schottky diode biased with a bias resistance of $R_b$=135 ohms and with a source impedance of $Z_0$=75 ohms. As indicated by this plot, the magnitude of the output current of the second order distortion generator (i.e., the predistortion) decreases with increasing diode bias current levels from 1 mA to 15 mA.

In one embodiment, therefore, the diode bias current ($I_b$) may be set as high as possible (i.e., to minimize phase deviation) without reducing the magnitude of the predistortion to a level that is unable to provide compensation for the distortion generated by the laser device or other non-linear amplifier. The diode bias current ($I_b$) may also be used as the only control for adjusting the magnitude of the predistortion such that the predistortion magnitude substantially matches the magnitude of the distortion generated by the laser device or other non-linear amplifier. The diode bias current ($I_b$) may further be used together with one or more magnitude control elements (e.g., an attenuator and/or gain element) to adjust the predistortion magnitude and/or the magnitude/phase versus frequency, as mentioned above.

By using an adjustable bias to bias the distortion generator diodes, embodiments of the predistortion circuit may thus integrate magnitude, magnitude versus frequency, and phase versus frequency control with the distortion generator for improved distortion compensation capability. One embodiment of the distortion generator may thus be used to compensate distortion having frequency-dependent amplitude and phase distortion characteristics without requiring separate components in the secondary signal path to provide adjustments for amplitude, frequency tilt and/or phase.

According to other embodiments of the present invention, the AC drive level in the predistortion circuit may also be set such that the magnitude of the AC input signal (e.g., the RF input to the distortion generator) is small relative to the DC bias current to minimize self phase modulation and distortion caused by self phase modulation. For a particular system, an acceptable amount of self phase modulation induced distortion may be determined, and the ratio of the magnitude of the AC input signal to the DC bias current (AC/DC ratio) may be set low enough such that the self phase modulation induced distortion is less than or equal to the predefined acceptable self phase modulation induced distortion. For a given minimum acceptable bias current, therefore, a maximum acceptable AC drive level may be determined that corresponds to this acceptable self phase modulation induced distortion, and the AC drive level may be maintained at a level lower than the maximum acceptable AC drive level. In one embodiment, the AC drive level may be set by selecting the first directional coupler (e.g., direction splitter 212) and pre-diode gain (if any) that results in an AC drive level that does not exceed in the maximum AC drive level.

In further embodiments, the second order distortion generator (e.g., distortion generators 222, 300a-300c, or 422) may also be configured with diodes having characteristics that minimize the phase deviation and phase modulation effects. In one embodiment, for example, the diodes (e.g., diodes 310, 312) may have a relatively low zero bias junction capacitance ($C_j0$). FIG. 7 shows a plot of the $R_jC_j$ time constants as a function of diode bias current ($I_b$) for two different diodes having a zero bias junction capacitance of $C_j0$=0.18 pF and $C_j0$=0.7 pF. As indicated, the $R_jC_j$ time constant is higher for the diode with the higher zero bias junction capacitance ($C_j0$=0.7 pF) at equivalent bias levels. In an exemplary embodiment with a bias current of $I_b$=5 mA, the diode with the lower zero bias junction capacitance of $C_j0$=0.18 pF results in a phase deviation or mismatch of about 0.5 degrees, whereas the diode with the higher zero bias junction capacitance of $C_j0$=0.7 pF results in a phase deviation or mismatch of about 2 degrees.

Figure 8:
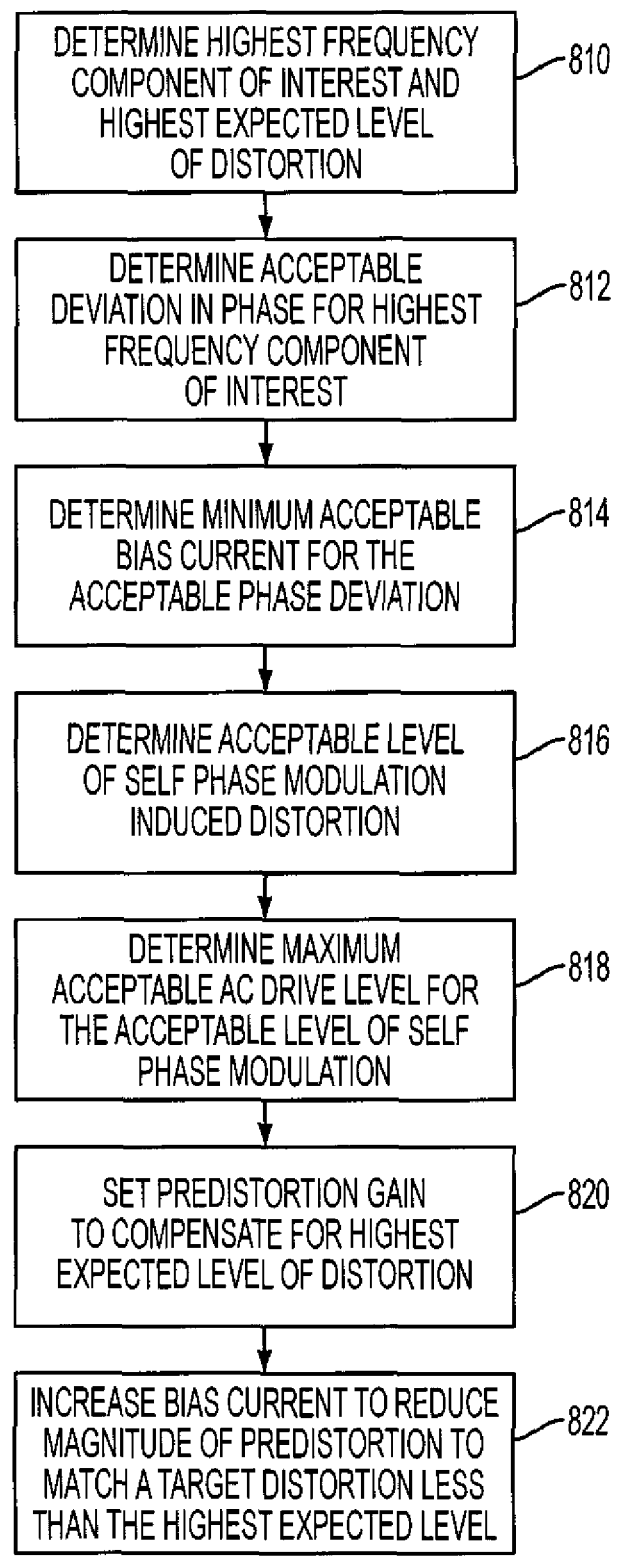
FIG. 8 is a flow chart illustrating one method of configuring a predistortion circuit, consistent with one embodiment of the present invention.

FIG. 8 illustrates one method of configuring a predistortion circuit for use with a non-linear amplifier, such as a laser in an optical transmitter. The predistortion circuit configured according to this method may have any of the configurations described above. The laser or other non-linear amplifier has an operating bandwidth or range of frequencies for which the laser or non-linear amplifier is designed to operate. The predistortion circuit may be configured for different lasers or non-linear amplifiers having different levels of distortion.

The exemplary method includes determining 810 a highest frequency component of interest associated with a non-linear amplifier and a highest expected level of distortion. In one exemplary embodiment where a laser is used in a laser transmitter designed for forward path CATV applications, for example, the highest frequency component of interest may be 1 GHz. The highest expected level of distortion is the highest magnitude of distortion generated by a non-linear amplifier (i.e., a worst case device) that may be compensated by the predistortion circuit.

The exemplary method also includes determining 812 an acceptable deviation in phase for the highest frequency component of interest. The acceptable deviation in phase that may be tolerated in a particular system and application may be determined from the target optimization specifications. After determining an acceptable phase deviation, a minimum acceptable bias current (e.g., 1 mA) may be determined 814 for the acceptable phase deviation such that the phase deviation is less than or equal to the acceptable phase deviation when the bias current is at or higher than the minimum acceptable bias current.

The exemplary method may also include determining 816 an acceptable level of self phase modulation induced distortion. The acceptable level of self phase modulation induced distortion that may be tolerated in a particular system and application may also be determined from the target optimization specifications. After determining an acceptable level of self phase modulation induced distortion, a maximum acceptable AC drive level may be determined 818 for the acceptable level of self phase modulation induced distortion such that the self phase modulation induced distortion is less than or equal to the acceptable level when the AC drive level is below the maximum acceptable AC drive level and the bias current is at the minimum acceptable bias current. The AC drive level may also be set high enough such that the output of the distortion generator is not too small to compensate for the highest expected level of distortion.

The exemplary method further includes setting 820 the predistortion gain such that a magnitude of the predistortion is capable of compensating the highest expected level of distortion, for example, given the minimum acceptable bias current and the maximum acceptable AC drive level. If necessary, setting the predistortion gain may include adding a fixed gain (e.g., a gain element) after the distortion generator to increase the magnitude of the predistortion to substantially match the magnitude of the highest expected level of distortion.

The bias current may then be increased 822 to reduce the magnitude of the predistortion to match a target distortion that is less than the highest expected level such that the distortion is compensated. The bias current may thus be used as the sole means to adjust the predistortion magnitude, for example, if the predistortion circuit is used with a device or in a system that requires less compensation (i.e., less than the highest expected level of distortion). One embodiment of a predistortion circuit may thus be configured such that the output may be reduced by diode bias current alone to provide a small output level for devices that require little or no distortion compensation, without requiring a variable attenuator. The bias current may also be adjusted during operation (e.g., on-the-fly) to adjust the predistortion magnitude in response to changes in the distortion. For the reasons discussed above, increasing the bias current to reduce the predistortion magnitude will not degrade, and may improve, the phase match and self-phase modulation induced distortion effects.

Although an exemplary method of configuring a predistortion circuit is shown and described above, those skilled in the art will recognize that variations of this method are possible and within the scope of the present invention. For example, one or more acts involved in the configuration of the predistortion circuit may be performed in a different sequence or may be eliminated. Also, one or more additional acts involved in the configuration of the predistortion circuit may be performed in addition to or instead of those described above.

Consistent with one embodiment, a predistortion circuit for a non-linear amplifier includes a primary signal path configured to receive at least a portion of an input signal and a secondary signal path coupled to the primary signal path and configured to receive at least a portion of the input signal. The secondary signal path includes a distortion generator configured to produce predistortion from the input signal on the secondary path and including at least first and second diodes and adjustable impedance matching elements configured to adjust impedance matching in the distortion generator. The predistortion circuit further includes an adjustable bias control coupled to the first and second diodes. The adjustable bias control is configured to adjust a bias current provided to the diodes to control at least phase and magnitude of the predistortion such that the predistortion is capable of compensating for distortion generated by the non-linear amplifier at a highest frequency component of interest for the non-linear amplifier.

Consistent with another embodiment, an optical system includes a RF signal input configured to provide a RF input signal and a predistortion circuit configured to receive the RF input signal and to generate a predistorted RF input signal. The predistortion circuit includes a primary signal path configured to receive at least a portion of the RF input signal and a secondary signal path coupled to the primary signal path and configured to receive at least a portion of the RF input signal. The secondary signal path includes a second order distortion generator configured to produce predistortion from the RF input signal and including at least first and second diodes. The optical system also includes a laser driving circuit configured to receive the predistorted RF input signal and to generate a modulated laser output. The predistorted RF input signal compensates for the distortion generated by the laser. The optical system further includes an adjustable bias control coupled to the first and second diode. The adjustable bias control is configured to adjust a bias current provided to the diodes to adjust the magnitude of the predistortion such that the adjustable bias control provides the only control for adjusting the magnitude of the predistortion. The predistortion is capable of compensating for distortion generated by a laser at a highest frequency component of interest.

Consistent with a further embodiment, a method is provided for configuring a predistortion circuit for use with a non-linear amplifier. The method includes providing a predistortion circuit including a primary signal path configured to receive at least a portion of an input signal and a secondary signal path coupled to the primary signal path and configured to receive at least a portion of the input signal. The secondary signal path includes a second order distortion generator configured to produce predistortion from the input signal, and the second order distortion generator includes at least first and second diodes. The method further includes adjusting a bias current provided to the diodes to control phase and magnitude of the predistortion such that the predistortion is capable of compensating for distortion generated by the non-linear amplifier at a highest frequency component of interest for the non-linear amplifier.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A predistortion circuit for a non-linear amplifier, the predistortion circuit comprising:
   a primary signal path configured to receive at least a portion of an input signal;
   a secondary signal path coupled to the primary signal path and configured to receive at least a portion of the input signal, the secondary signal path comprising a distortion generator configured to produce predistortion from the input signal on the secondary path, the distortion generator comprising at least first and second diodes and adjustable impedance matching elements in the secondary signal path and configured to adjust impedance matching in the distortion generator; and
   an adjustable bias control coupled to the first and second diodes, the adjustable bias control being configured to adjust a bias current provided to the diodes to control at least one of phase and magnitude of the predistortion such that the predistortion is capable of compensating for distortion generated by the non-linear amplifier at a highest frequency component of interest for the non-linear amplifier.

2. The predistortion circuit of claim 1 wherein the adjustable bias control is configured to adjust the bias current high enough such that a deviation in phase match between the predistortion on the secondary signal path and the input signal on the primary signal path is less than or equal to a predefined acceptable deviation at the highest frequency component of interest for the non-linear amplifier.

3. The predistortion circuit of claim 1 wherein the adjustable bias control is configured to adjust the bias current to provide the only control for adjusting the magnitude of the predistortion.

4. The predistortion circuit of claim 1 wherein the secondary signal path includes at least one gain element configured to increase the gain of the predistortion.

5. The predistortion circuit of claim 1 wherein the secondary signal path includes at least one gain control element configured to adjust the magnitude of the predistortion.

6. The predistortion circuit of claim 5 wherein the gain control element is a variable attenuator.

7. The predistortion circuit of claim 1 wherein the first and second diodes include a series pair of diodes connected in series relative to the bias current.

8. The predistortion circuit of claim 1 wherein the distortion generator further comprises at least first and second DC blocking capacitors coupled to the first and second diodes, respectively.

9. The predistortion circuit of claim 1 wherein the adjustable impedance matching elements include adjustable resistors coupled to the first and second diodes.

10. An optical system comprising:
   a RF signal input configured to provide a RF input signal;
   a predistortion circuit configured to receive the RF input signal and to generate a predistorted RF input signal, the predistortion circuit comprising:
      a primary signal path configured to receive at least a portion of the RF input signal; and
      a secondary signal path coupled to the primary signal path and configured to receive at least a portion of the RF input signal, the secondary signal path comprising a second order distortion generator configured to produce predistortion from the RF input signal, the second order distortion generator comprising at least first and second diodes;
   a laser configured to receive the predistorted RF input signal and to generate a modulated optical output, wherein the predistorted RF input signal compensates for the distortion generated by the laser; and
   an adjustable bias control coupled to the first and second diodes, the adjustable bias control being configured to adjust a bias current provided to the diodes to adjust a magnitude of the predistortion such that the adjustable bias control provides the only control for adjusting the magnitude of the predistortion, wherein the predistortion is capable of compensating for distortion generated by the laser at a highest frequency component of interest.

11. The optical system of claim 10 wherein the adjustable bias control is configured to adjust the bias current high enough such that a deviation in phase match between the predistortion on the secondary signal path and the input signal on the primary signal path is less than or equal to a predefined acceptable deviation at the highest frequency component of interest for the non-linear amplifier.

12. The optical system of claim 10 wherein the second order distortion generator is configured to provide the input signal to the diodes with a magnitude at a level that is small enough such that distortion caused by self phase modulation is less than or equal to a predefined acceptable self-phase modulation induced distortion.

13. The optical system of claim 10 wherein the secondary signal path includes a fixed gain element to increase the magnitude of the predistortion to compensate for a highest expected level of distortion in the laser, and wherein the adjustable bias control is configured to controllably increase the bias current to controllably decrease the magnitude of the predistortion to compensate for distortion having a magnitude less than the highest expected level.

14. A method of configuring a predistortion circuit for use with a non-linear amplifier, the method comprising:
   providing a predistortion circuit including a primary signal path configured to receive at least a portion of an input signal and a secondary signal path coupled to the primary signal path and configured to receive at least a portion of the input signal, the secondary signal path comprising a second order distortion generator configured to produce predistortion from the input signal, the second order distortion generator comprising at least first and second diodes; and
   adjusting a bias current provided to the diodes to control at least one of phase and magnitude of the predistortion such that the predistortion is capable of compensating for distortion generated by the non-linear amplifier at a highest frequency component of interest for the non-linear amplifier.

15. The method of claim 14 further comprising:
   determining an acceptable deviation in phase between the predistortion on the secondary signal path and the input signal on the primary signal path for the highest frequency component of interest; and
   wherein adjusting the bias current provided to the diodes includes adjusting the bias current to be high enough such that any deviation in phase between the predistortion and the input signal on the primary signal path is less than the acceptable deviation in phase and such that a magnitude of the predistortion is sufficient to compensate for distortion generated by the non-linear amplifier.

16. The method of claim 14 further comprising determining an acceptable self-phase modulation induced distortion and setting an AC drive level of the input signal such that any distortion induced by self-phase modulation is less than the acceptable self-phase modulation induced distortion.

17. The method of claim 14 wherein adjusting the bias current provided to the diodes includes adjusting the bias current to adjust the magnitude of the predistortion.

18. The method of claim 14 further comprising:
   determining an acceptable deviation in phase between the predistortion on the secondary signal path and the input signal on the primary signal path for the highest frequency component of interest and determining a minimum acceptable bias current corresponding to the acceptable phase deviation;
   determining an acceptable self-phase modulation induced distortion and determining a maximum acceptable AC drive level corresponding to the minimum bias current and the acceptable self-phase modulation induced distortion;
   setting predistortion gain for the minimum acceptable bias current and the maximum acceptable AC drive level such that a magnitude of the predistortion is capable of compensating a highest expected level of distortion generated by a non-linear amplifier; and
   wherein adjusting the bias current includes increasing the bias current to reduce the magnitude of the predistortion to compensate a target distortion of a non-linear amplifier that is less than the highest expected level of distortion.

19. The method of claim 18 wherein setting the predistortion gain comprises providing a gain element after the second order generator to increase the magnitude of the predistortion output from the second order generator such that the predistortion is capable of compensating the highest expected level of distortion generated by a non-linear amplifier.

20. The method of claim 14 wherein adjusting the bias current includes adjusting the bias current to control at least one of magnitude and phase versus frequency.

21. The method of claim 14 further comprising adjusting impedance match within the distortion generator to control at least one of magnitude and phase versus frequency.

* * * * *